United States Patent [19]

Mummey et al.

[11] Patent Number: 4,548,453

[45] Date of Patent: Oct. 22, 1985

[54] RIGHT ANGLE COAXIAL PLUG CONNECTOR

[75] Inventors: Dale B. Mummey, Camp Hill; Alan E. Plotts, Harrisburg, both of Pa.

[73] Assignee: AMP Incorporated, Harrisburg, Pa.

[21] Appl. No.: 474,413

[22] Filed: Mar. 11, 1983

[51] Int. Cl.[4] .......... H05K 1/00

[52] U.S. Cl. .......... 339/17 C; 339/17 LC; 339/177 R

[58] Field of Search .......... 339/17 C, 17 LC, 17 LM, 339/177, 143, 14 R, 14 P, 278 C

[56] References Cited

U.S. PATENT DOCUMENTS

| | | | |
|---|---|---|---|
| 2,813,144 | 11/1957 | Valach | 339/177 R |
| 3,179,912 | 4/1965 | Huber et al. | 339/177 R |
| 3,514,737 | 5/1970 | Renshaw | 339/17 C |
| 3,605,075 | 9/1971 | Stofkooper | 339/278 C |
| 3,915,535 | 10/1975 | O'Keefe et al. | 339/17 C |
| 3,966,290 | 6/1976 | Little et al. | 339/17 LM |
| 3,980,382 | 9/1976 | Reeder | 339/177 R |
| 4,008,941 | 2/1977 | Smith | 339/91 P |
| 4,273,407 | 6/1981 | Snuffer et al. | 339/177 R |
| 4,360,244 | 11/1982 | Forney et al. | 339/177 R |
| 4,386,819 | 6/1983 | Asick et al. | 339/143 R |
| 4,425,015 | 1/1984 | Rizzo | 339/278 C |
| 4,431,253 | 2/1984 | Hochgesang et al. | 339/177 R |

*Primary Examiner*—Gil Weidenfeld
*Assistant Examiner*—David L. Pirlot
*Attorney, Agent, or Firm*—Adrian J. LaRue; Anton P. Ness

[57] ABSTRACT

A right angle coaxial plug connector comprises a mounting member in an upper surface of which is disposed a channel which is in communication with a hole normal to the channel. A contact pin extends outwardly from a bottom surface of the mounting member. A center contact is disposed along a dielectric member located within a tubular outer contact, the outer contact being electrically secured within the channel. A front section of the center contact extends outwardly from a front surface of the outer contact while a right-angled rear section of the center contact extends along a dielectric medium in the hole of the mounting member and includes a pin section extending outwardly from the mounting member parallel to the pin contact, the pin section and the pin contact being electrically connectable respectively to a ground plane and a signal path on a card.

9 Claims, 4 Drawing Figures

RIGHT ANGLE COAXIAL PLUG CONNECTOR

FIELD OF THE INVENTION

This invention relates to coaxial connectors and more particularly to right angle coaxial plug connectors for connection with circuits on a printed circuit board or card as part of coaxial patchboard system.

BACKGROUND OF THE INVENTION

Automatic test equipment is used to test electronic boards or cards and systems to make certain that they are properly operating. The automatic test equipment typically uses coaxial patchboard systems such as disclosed in U.S. Pat. Nos. 3,341,801 and 4,134,631. In one embodiment of the '631 patent, coaxial cable leads have one of their ends terminated to coaxial plug connectors and these are to be electrically connected into complementary coaxial receptacle connectors secured in holes in a dielectric connector block. The other ends of the coaxial cables are terminated to electrical terminals in a connector housing which is mounted on a printed circuit card with the electrical terminals thereof connected to ground and signal paths thereon. The cards are secured to respective connector blocks and the coaxial plug connectors electrically connected to respective complementary coaxial receptacle connectors.

This arrangement is costly because of the labor and parts involved in terminating ends of coaxial cables to connectors and mounting the card connector on the card. Such an arrangement also takes up space on the card which is needed for the components that form the test circuits on the card.

SUMMARY OF THE INVENTION

According to the present invention, a right angle coaxial plug connector comprises a mounting member in an upper surface of which is disposed a channel which is in communication with a hole normal to the channel. A contact pin extends outwardly from a bottom surface of the mounting member. A center contact is disposed along a dielectric member located within a tubular outer contact, the outer contact being electrically secured within the channel. A front section of the center contact extends outwardly from a front surface of the outer contact while a right-angled rear section of the center contact extends along a dielectric medium in the hole of the mounting member and includes a pin section extending outwardly from the mounting member parallel to the pin contact, the pin section and the pin contact being electrically connectable respectively to a ground plane and a signal path on a card.

According to another embodiment of the present invention, a card for use in a modular patchboard system comprises a connector block having a series of holes in which are mounted coaxial receptacle connectors. Right angle coaxial plug connectors are electrically connected with respective coaxial receptacle connectors and to respective ground and signal paths on a card.

DETAILED DESCRIPTION OF THE INVENTION

Figure 1:
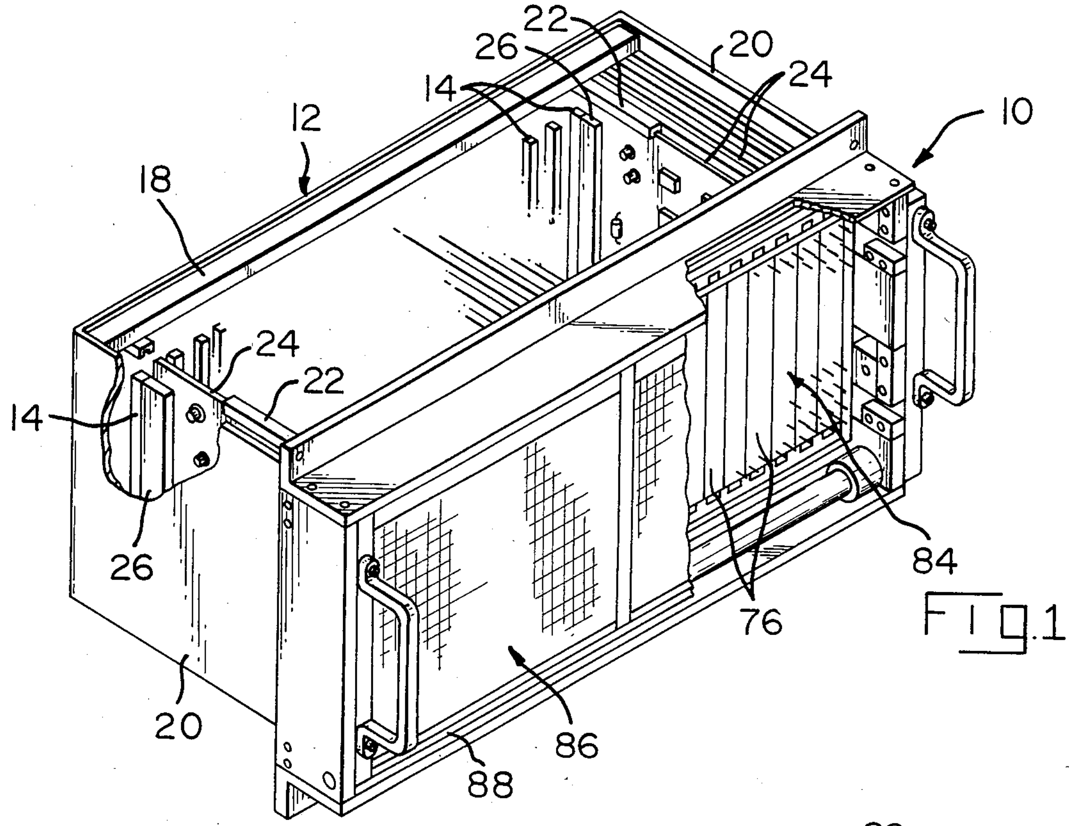
FIG. 1 is a perspective view of a modular interface connector device in the form of a coaxial patchboard system with parts broken away.
Figure 4:
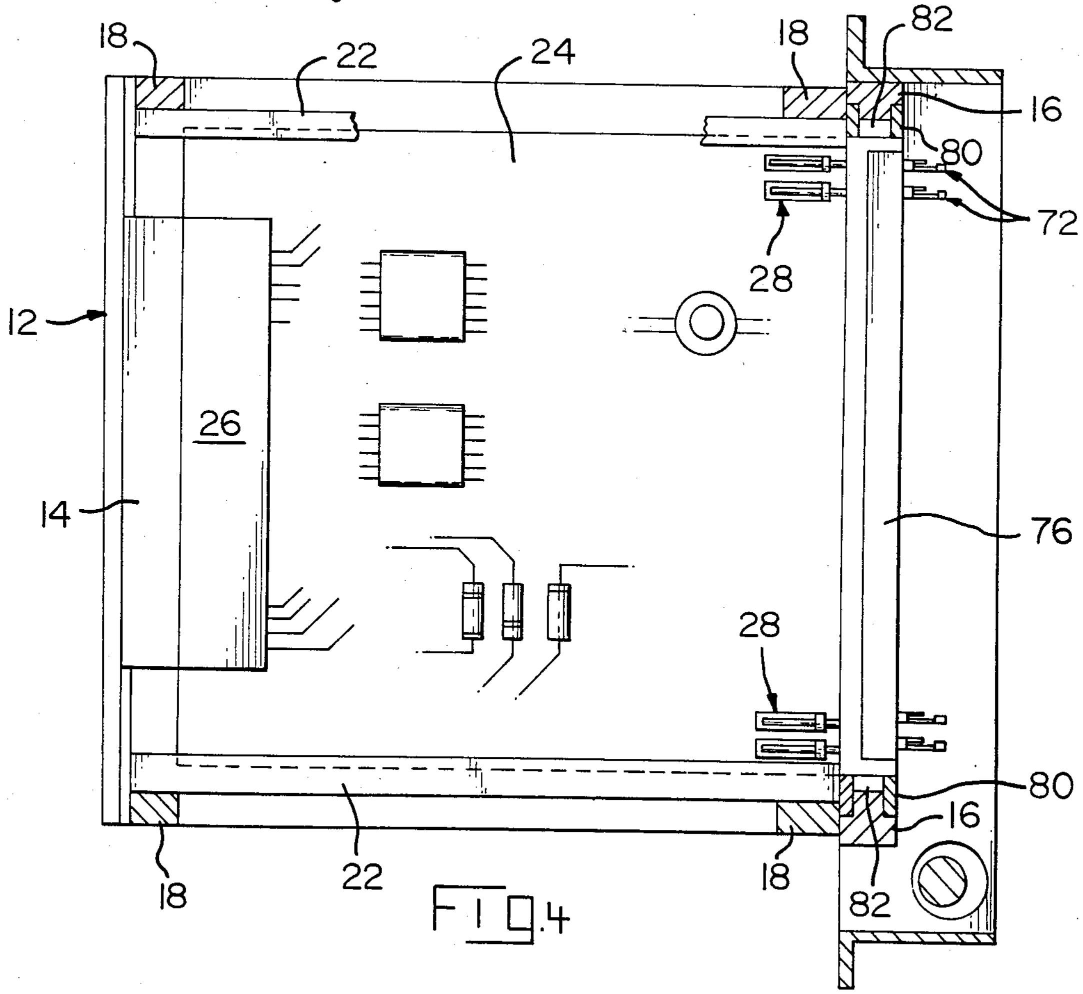
FIG. 4 is an enlarged fragmentary elevational view with parts in section showing a card mounted in the rear bay of FIG. 1.

A modular interface connector device in the form of a modular coaxial patchboard system 10 is completely disclosed in U.S. Pat. No. 4,134,631 and is incorporated by reference herein. System 10 includes an I/O circuit board 12 which has a plurality of vertically extending electrical connectors 14 electrically connected thereto. I/O circuit board 12 contains all of the input and output electrical connections to the electrical and electronic circuits of the equipment to be programmed. Such connections extend to the I/O circuit board 12 and are electrically connected to electrical connectors 14. A card cage is formed of a front frame 16 to which is secured a rear frame 18. Sidewalls 20 are secured to rear frame 18 and enclose the same. Channels 22 are secured to the top and bottom sections of rear frame 18 in opposed relationship to define tracks along which cards 24 extend between front frame 16 and electrical connectors 14 on circuit board 12 as shown in FIGS. 1 and 4.

Figure 2:
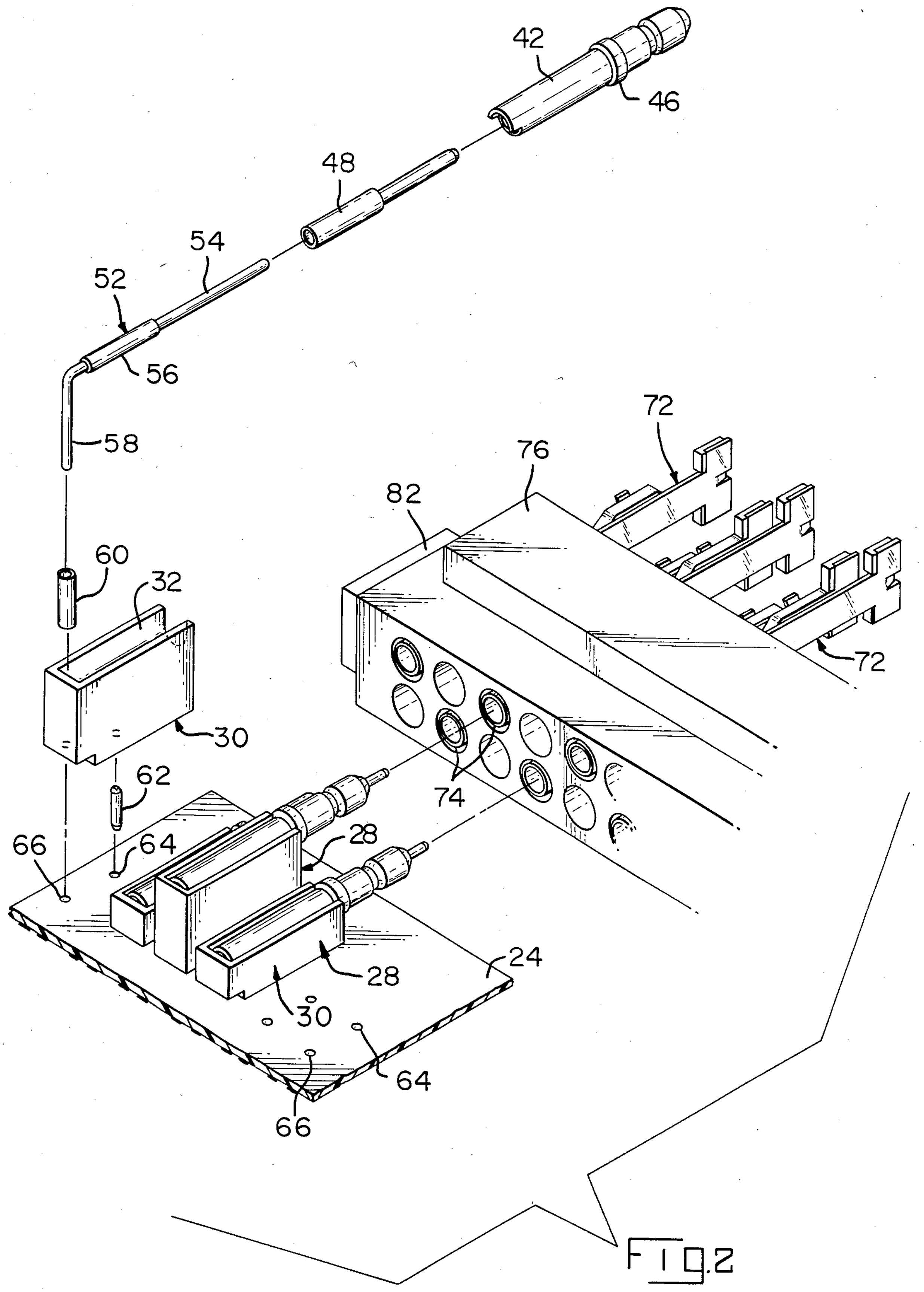
FIG. 2 is an exploded and perspective view of a card for use in the coaxial patchboard system of FIG. 1 to which is connected right angle coaxial plug connectors for electrical connection with respective coaxial receptacle connectors in a dielectric connector block, parts of one of the coaxial plug connectors being shown exploded from each other.

Each card 24 has circuit paths thereon in the form of signal paths and a ground plane which interconnect electronic components thereon to form electronic circuits which are programmable to generate test signal patterns for testing electronic equipment. At the back end of each of cards 24 are electrical connectors 26 which are electrically matable with electrical connectors 14 when cards 24 are inserted along tracks 22. A row of right angle coaxial plug connectors 28 extend across the front of each of cards 24 with alternative ones of coaxial plug connectors 28 having the same height so the axes of lower-profiled plug connectors are in a plane parallel with the plane containing the axes of the higher-profiled plug connectors as shown in FIG. 2.

Figure 3:
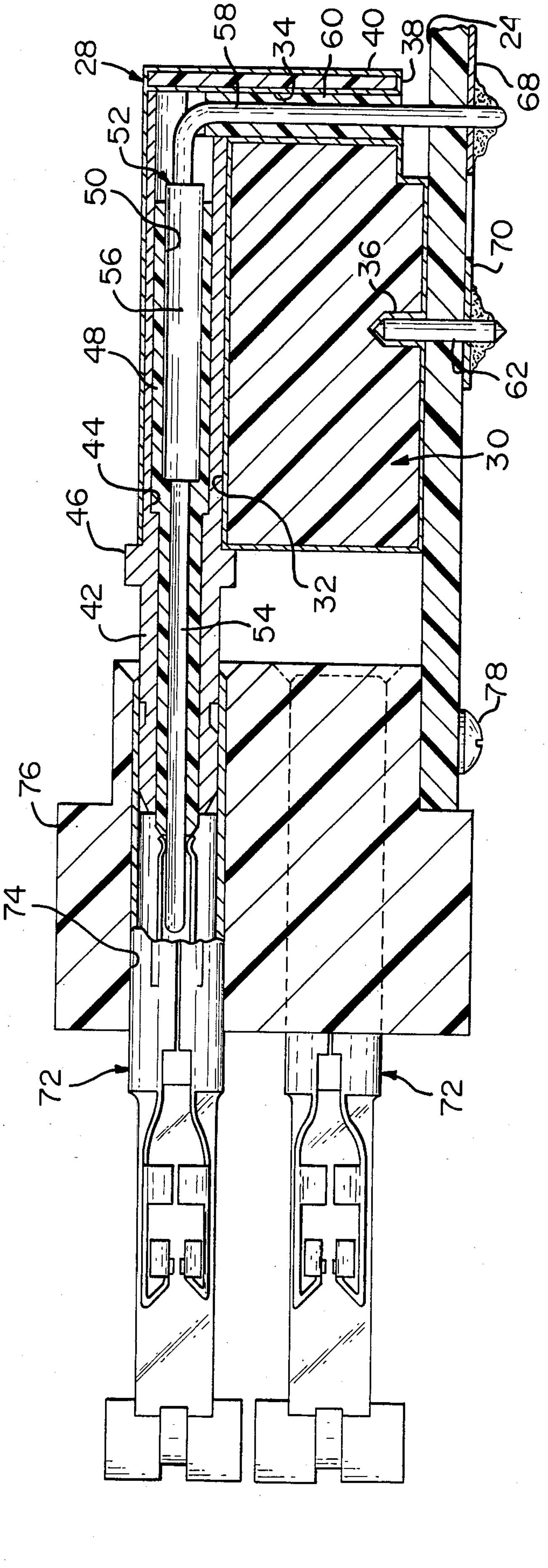
FIG. 3 is a cross-sectional view of the coaxial plug connector in an assembled condition and in electrical connection with a coaxial receptacle connector secured in a connector block.

Each coaxial plug connector 28 comprises a mounting member 30 which is preferably molded from a suitable plastic material. Mounting member 30 has an upper surface, a bottom surface, opposing sides, a front surface and a rear end. A sleeve-receiving channel 32 is disposed in a upper surface of mounting member 30 and communicates with a hole 34 at the rear end thereof which is normal to channel 32 as shown in FIG. 3. A blind hole 36 is located in the bottom surface of mounting member 30 and the bottom surface includes a stepped surface 38 spaced inwardly from the bottom surface and through which hole 34 extends. The exterior surfaces of mounting member 30 including hole 34 and blind hole 36 are plated with a suitable metal coating 40 in accordance with conventional plastic plating practices so that mounting member 30 forms part of the outer contact of the coaxial plug connector and increases the shielding thereof. Mounting member 30 can be machined or die cast metal, if desired.

A metal sleeve 42 has a stepped bore 44 extending therethrough and an annular collar 46 extending outwardly from an external surface thereof. A stepped dielectric sleeve 48 is disposed in stepped bore 44 of metal sleeve 42 and it also includes a stepped bore 50 extending therethrough, stepped bore 44 limiting movement of stepped sleeve 48 therein. A small section of dielectric sleeve 48 extends outwardly from the front surface of sleeve 42. A center contact member 52 is disposed in stepped bore 50 of dielectric sleeve 48 and has a front contact section 54 extending through the smaller diameter section of stepped bore 50 which includes a front contact section extending outwardly beyond the forward end of dielectric sleeve 48. A center section 56 of center contact member 52 is disposed in the larger section of stepped bore 50 of dielectric sleeve 48 which limits movement of center contact member 52 therein and a rear contact section 58 of center contact member 52 is curved into a right angle contact section and is disposed in a dielectric sleeve 60 disposed in hole 34 and includes a rear contact portion extending outwardly from stepped surface 38 beyond the bottom surface of mounting member 30. Sleeve 42 is undercut at the end from which rear contact section 58 extends. The rear contact portion is parallel with respect to metal pin 62 electrically connected with the plated hole 36 in mounting member 30. Rear contact section 58 can extend through hole 34 without the use of dielectric sleeve 60 so that contact section 58 would then be disposed in an air dielectric medium.

The section of metal sleeve 42 extending rearwardly of annular collar 46 extends along plated channel 32 of mounting member 30 and is secured thereinto by a conductive epoxy material so that metal sleeve 42 is electrically connected to metal-plated mounting member 30. As can be discerned from FIG. 2, every other coaxial plug connector 28 has a mounting member higher than the other mounting members when they are mounted in a row on card 24 so that rear contact sections 58 of center contact members 52 and metal pins 62 of respective plug connectors 28 are positionable in holes 64 and 66 of card 24 so as to be respectively electrically connected to signal paths 68 and ground plane 70 of card 24 by conventional flow soldering practices.

After coaxial plug connectors 28 have been electrically connected to card 24, plug connectors 28 are then electrically connected with respective coaxial receptacle connectors 72 secured in holes 74 extending through connector block 76 which is molded from a suitable dielectric material. Alternatively, connectors 28 can be electrically connected with respective connectors 72 in connector block 76 and then electrically connected with the signal paths and ground plane of card 24.

Coaxial receptacle connectors 72 are completely disclosed in U.S. Pat. No. 3,341,801 which is incorporated herein by reference and it has center contacts and outer contacts respectively connected with the center contacts and outer contacts of coaxial plug connectors 28 as shown in FIG. 3. Cards 24 are then secured to connector blocks 76 by screws 78 so that the connector blocks 76 and cards 24 electrically connected together by plug connectors 28 and receptacle connectors 72 form programmed test circuits that are secured in position in front frame 16 and rear frame 18 along channels 22 with electrical connectors 26 of cards 24 electrically connected to respective electrical connectors 14 of circuit board 12 as shown in FIGS. 1 and 4. Connector blocks 76 are secured in position in front frame 16 by plates 80 secured thereto and in engagement with projections 82 of connector blocks 76 which extend outwardly from the top and bottom surfaces of connector blocks 76 and are disposed in respective channels in front frame 16. With this arrangement, a rear bay 84 of the patchboard system is formed which is electrically connected to the electrical connectors of a front bay 86 which is secured in a frame 88. Coaxial plug patchboard connectors are electrically connected between coaxial receptacle connectors in front bay 86 to interconnect the electronic circuits of cards 24 to establish test programs that generate test signals to test electronic equipment connected to the patchboard system. The operation of patchboard system 10 is completely disclosed in U.S. Pat. Nos. 3,341,801 and 4,134,631 and need not be described here.

As can be discerned, a unique right angle coaxial plug connector is disclosed which is used in conjunction with a program card as part of a connector block and card assembly to form a back bay of a coaxial patchboard system.

We claim:

1. A right angle coaxial plug connector for mounting on a printed circuit board for electrical connection with signal and ground conductive paths thereon, comprising:

a conductive mounting member having a bottom surface, an upper surface, opposing sides, a front surface and a rear end, said bottom surface for mechanical engagement with the printed circuit board and for electrical connection with the ground conductive path thereon, a sleeve-receiving channel extending into said mounting member from said upper surface and rearwardly from said front surface thereof, said upper and bottom surfaces being substantially parallel, said mounting member having a hole adjacent said rear end thereof extending through said bottom surface, said hole being in communication with said sleeve-receiving channel and being substantially normal thereto;

dielectric means extending along said hole;

conductive sleeve member securable in said mounting member and having a first section and a second section and a bore therethrough, said first section extending from said second section to an inner sleeve end and along said sleeve-receiving channel and being mechanically secured in said channel with said inner sleeve end being disposed proximate said hole and having an undercut therein such that said bore is in communication with said hole, and said second section of said conductive sleeve member extending outwardly from said front surface of said mounting member defining an outer contact member;

a dielectric sleeve disposed within said conductive sleeve member and extending from at least a front surface of said conductive sleeve member to a position adjacent said inner sleeve end; and a center contact having a first section extending along said dielectric sleeve, a second section extending outwardly from said front surface of said conductive sleeve member defining a center contact member and a third section which extends outwardly from said inner end of said sleeve member, extends at a right angle through said undercut and extends along said dielectric means of said hole and extends beyond the section of said bottom surface at which said hole is located.

2. A right angle coaxial plug connector as set forth in claim 1, wherein said conductive sleeve has an annular projection at a junction of said first and second sections and is disposed adjacent said mounting member.

3. A right angle coaxial plug connector as set forth in claim 1, wherein said dielectric means in said hole is a dielectric sleeve member.

4. A right angle coaxial plug connector as set forth in claim 1, wherein said bottom surface of said mounting member has a stepped surface through which said hole extends.

5. A right angle coaxial plug connector as set forth in claim 1, wherein said mounting member is a plastic member having a metal coating exterior surfaces thereof.

6. A right angle coaxial plug connector as set forth in claim 5, wherein a metal-coated hole is located in said bottom surface of said mounting member parallel to said hole in communication with said sleeve receiving channel, a metal pin being mechanically secured in said metal-coated hole.

7. A connector block and card assembly, comprising:

a dielectric connector block having a series of holes extending therethrough;

coaxial receptacle connectors secured in respective ones of said series of holes, each of the coaxial receptacle connectors having outer contact means and center contact means;

a dielectric card secured to said connector block and having conductive signal paths and ground plane means thereon;

right angle coaxial plug connectors mounted on said dielectric card, each of said coaxial plug connectors having a conductive mounting member including a bottom surface, an upper surface, opposing sides, a front surface and a rear end, said bottom surface mechanically engaging the dielectric card and being electrically connected to said ground plane means, a sleeve-receiving channel extending into said mounting member from said upper surface and rearwardly from said front surface thereof, said upper and bottom surfaces being substantially parallel, said mounting member having a hole adjacent said rear end thereof, said hole being in communication with said sleeve-receiving channel and being substantially normal thereto;

dielectric means extending along said hole;

a conductive sleeve member securable in said mounting member and having a first section and a second section and a bore therethrough, said first section extending from said second section to an inner sleeve end and along said sleeve-receiving channel and being mechanically secured in said channel with said inner sleeve end being disposed proximate said hole and having an undercut thereon such that said bore is in communication with said hole, and said second section of said conductive sleeve member extending outwardly from said front surface of said mounting member defining an outer contact member;

a dielectric sleeve disposed within said conductive sleeve member and extending from at least a front surface of said conductive sleeve member to a position adjacent said inner sleeve end;

a center contact having a first section extending along said dielectric sleeve, a second section extending outwardly from said front surface of said conductive sleeve member defining a center contact member and a third section which extends outwardly from said inner end of said sleeve member, extends at a right angle through said undercut and extends along said dielectric means of said hole and beyond the section of said bottom surface at which said hole is located and is electrically connected to a respective signal path; and said plug connectors being matable with respective receptacle connectors with the outer contact means and the center contact means of the receptacle connectors being electrically connected with the respective outer contact members and center contact members of the plug connectors.

8. A connector block and card assembly as set forth in claim 7, wherein said mounting member is plastic having a metal coating exterior surfaces thereof.

9. A connector block and card assembly as set forth in claim 7, wherein alternate ones of said coaxial plug connectors have mounting members that are higher than the other of the mounting members.

* * * * *